US011493573B2

United States Patent
Hu et al.

(10) Patent No.: US 11,493,573 B2
(45) Date of Patent: *Nov. 8, 2022

(54) MAGNETIC SENSOR WITH DUAL TMR FILMS AND THE METHOD OF MAKING THE SAME

(71) Applicant: Western Digital Technologies, Inc., San Jose, CA (US)

(72) Inventors: Chih-Ching Hu, Pleasanton, CA (US); Yung-Hung Wang, San Jose, CA (US); Ann Lorraine Carvajal, Lathrop, CA (US); Ming Mao, Dublin, CA (US); Chen-Jung Chien, Mountain View, CA (US); Yuankai Zheng, Fremont, CA (US); Ronghui Zhou, Fremont, CA (US); Dujiang Wan, San Ramon, CA (US); Carlos Corona, Pleasanton, CA (US); Daniele Mauri, San Jose, CA (US); Ming Jiang, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 333 days.

This patent is subject to a terminal disclaimer.

(21) Appl. No.: 16/718,346

(22) Filed: Dec. 18, 2019

(65) Prior Publication Data

US 2021/0063502 A1  Mar. 4, 2021

Related U.S. Application Data

(60) Provisional application No. 62/892,232, filed on Aug. 27, 2019.

(51) Int. Cl.
*G01R 33/09* (2006.01)
*H01L 43/08* (2006.01)
(Continued)

(52) U.S. Cl.
CPC ....... *G01R 33/098* (2013.01); *H01F 10/3254* (2013.01); *H01F 10/3272* (2013.01);
(Continued)

(58) Field of Classification Search
CPC .............. G01R 33/098; G01R 33/0052; G01R 33/0005; G01R 33/093; H01F 10/3254;
(Continued)

(56) References Cited

U.S. PATENT DOCUMENTS 7,286,329 B1 * 10/2007 Chen .............. G01R 31/318357
360/324.12
9,591,221 B2   3/2017 Miller et al.
(Continued)

FOREIGN PATENT DOCUMENTS

CN      101788596 A   7/2010
EP        3006951 A1   4/2016
JP      2018073913 A   5/2018

OTHER PUBLICATIONS

International Search Report and the Written Opinion for International Application No. PCT/US2020/024095 dated Jul. 14, 2020, 10 pages.

(Continued)

*Primary Examiner* — Alvaro E Fortich
*Assistant Examiner* — Zannatul Ferdous
(74) *Attorney, Agent, or Firm* — Patterson & Sheridan, LLP; Steven H. VerSteeg

(57) ABSTRACT

A tunneling magnetoresistance (TMR) sensor device is disclosed that includes four or more TMR resistors. The TMR sensor device comprises a first TMR resistor comprising a first TMR film, a second TMR resistor comprising a second TMR film different than the first TMR film, a third TMR resistor comprising the second TMR film, and a fourth TMR resistor comprising the first TMR film. The first, (Continued)

second, third, and fourth TMR resistors are disposed in the same plane. The first TMR film comprises a synthetic anti-ferromagnetic pinned layer having a magnetization direction of the reference layer orthogonal to a free layer. The second TMR film comprises a double synthetic anti-ferromagnetic pinned layer having a magnetization direction of the reference layer orthogonal to the magnetization of a free layer, but opposite to the magnetization direction of the reference layer of the first TMR film.

20 Claims, 11 Drawing Sheets

(51) Int. Cl.
    *H01L 27/22*     (2006.01)
    *H01L 43/10*     (2006.01)
    *H01L 43/12*     (2006.01)
    *H01F 10/32*     (2006.01)
    *H01F 41/30*     (2006.01)

(52) U.S. Cl.
    CPC .......... *H01F 41/302* (2013.01); *H01L 27/22* (2013.01); *H01L 43/08* (2013.01); *H01L 43/10* (2013.01); *H01L 43/12* (2013.01)

(58) Field of Classification Search
    CPC ... H01F 10/3272; H01F 41/302; H01L 27/22; H01L 43/08; H01L 43/10; H01L 43/12
    See application file for complete search history.

(56) References Cited

U.S. PATENT DOCUMENTS

| | | |
|---|---|---|
| RE46,428 E | 6/2017 | Mather et al. |
| 9,684,184 B2 | 6/2017 | Miller et al. |
| 10,868,235 B2 * | 12/2020 | Beach .................. H01L 27/224 |
| 10,916,696 B2 * | 2/2021 | Pinarbasi ................ H01L 43/12 |
| 2004/0196693 A1 * | 10/2004 | Iwata ..................... G11C 29/08 365/158 |
| 2006/0127701 A1 | 6/2006 | Ruigrok et al. |
| 2011/0025320 A1 * | 2/2011 | Ohta ...................... H01L 27/22 324/252 |
| 2011/0169112 A1 * | 7/2011 | Chen ...................... H01L 43/08 257/E29.323 |
| 2012/0049843 A1 * | 3/2012 | Sun ........................ H01L 43/12 324/252 |
| 2012/0068698 A1 | 3/2012 | Chen et al. |
| 2015/0331071 A1 | 11/2015 | Davies |
| 2018/0335484 A1 | 11/2018 | Campiglio et al. |
| 2019/0020822 A1 | 1/2019 | Sharma et al. |
| 2021/0063503 A1 * | 3/2021 | Hu ....................... G01R 33/098 |

OTHER PUBLICATIONS

Ferreira et al. "2-Axis Magnetometers Based on Full Wheatstone Bridges Incorporating Magnetic Tunnel Junctions Connected in Series," IEEE Transactions on Magnetics, vol. 48, No. 11, Nov. 2012, pp. 4107-4110.

Freitas et al. "Spintronic Sensors," Proceedings of the IEEE, Oct. 2016, vol. 104, No. 10, pp. 1894-1918.

Liu et al. "Tunneling magnetoresistance sensors with different coupled free layers," AIP Advances, vol. 7, No. 5, Mar. 1, 2017, 12 pages, <https://doi.org/10.1063/1.4977774>.

Lopes "MgO Magnetic Tunnel Junction sensors in Full Wheatstone bridge configuration for Electrical current detection," Oct. 15, 2012, 8 pages, <https://fenix.tecnico.ulisboa.pt/downloadFile/395144787699/resumo.pdf>.

International Preliminary Report on Patentability for International Application No. PCT/US2020/024095 dated Mar. 10, 2022, 7 pages.

* cited by examiner

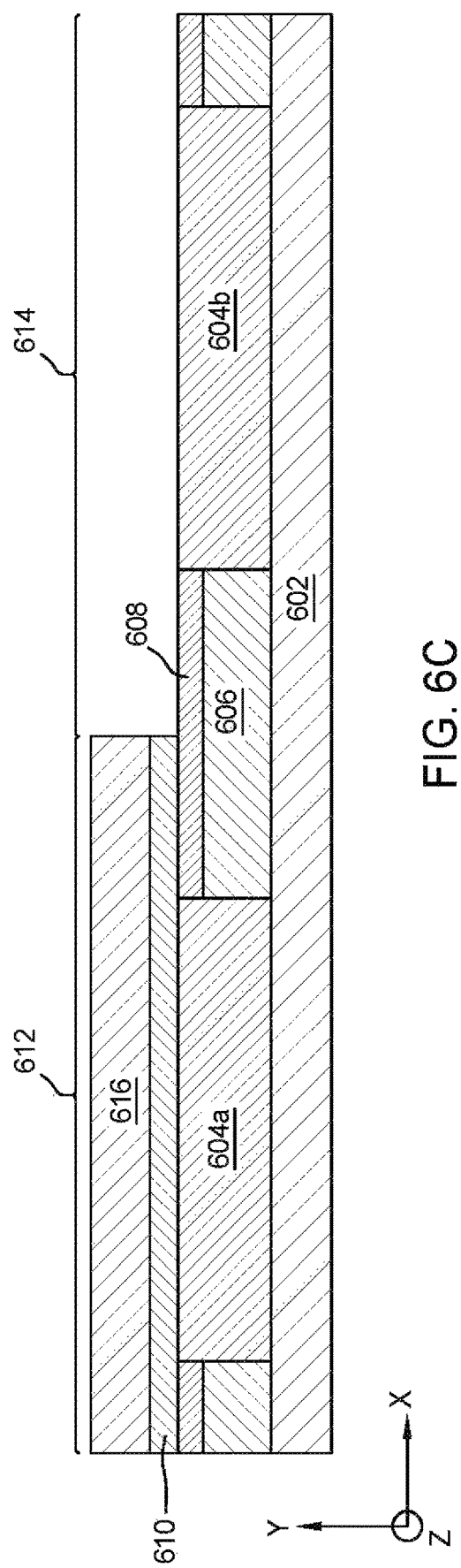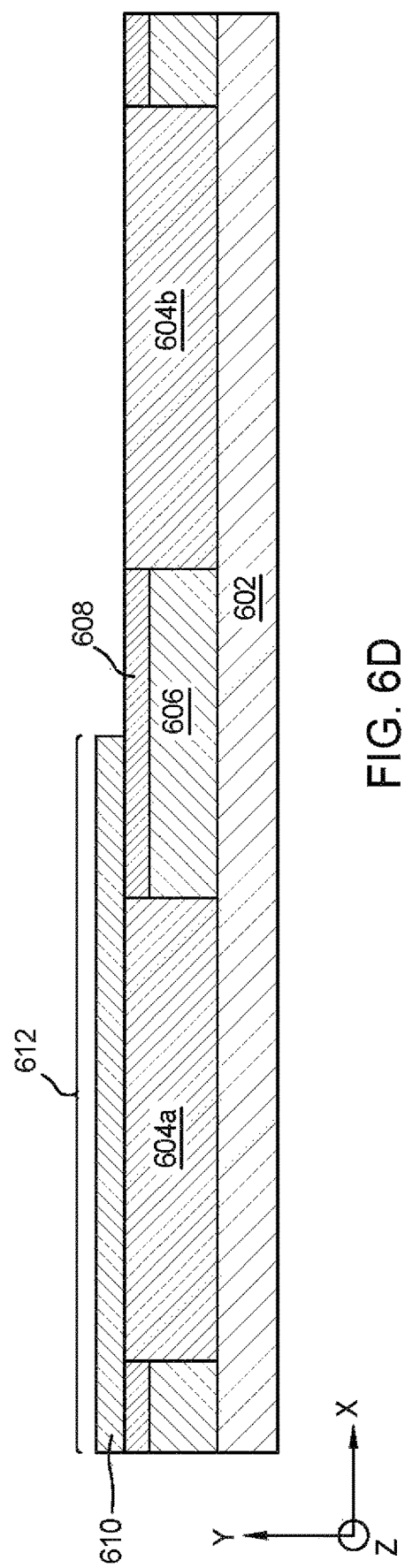
FIG. 6C
FIG. 6D

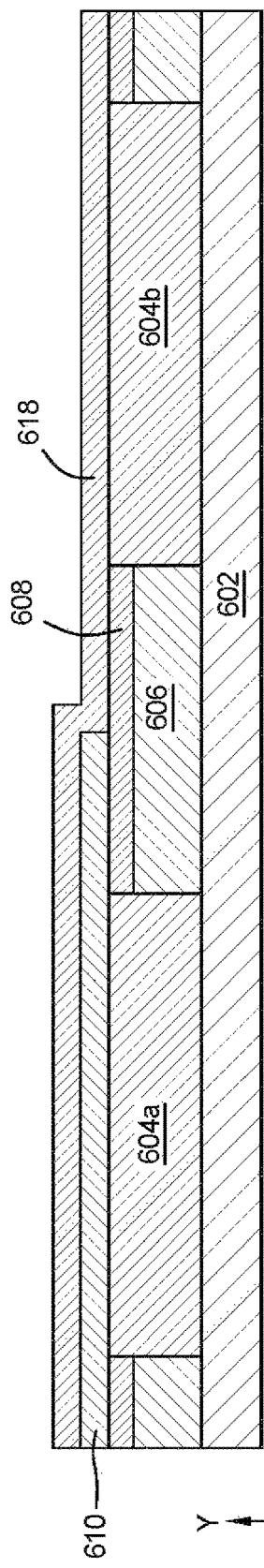
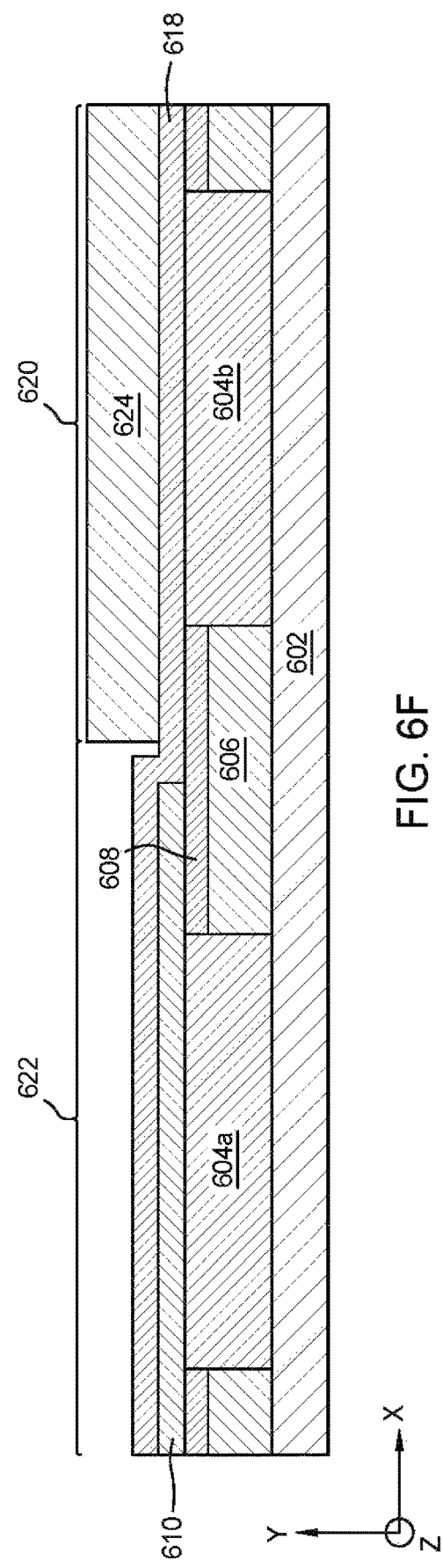

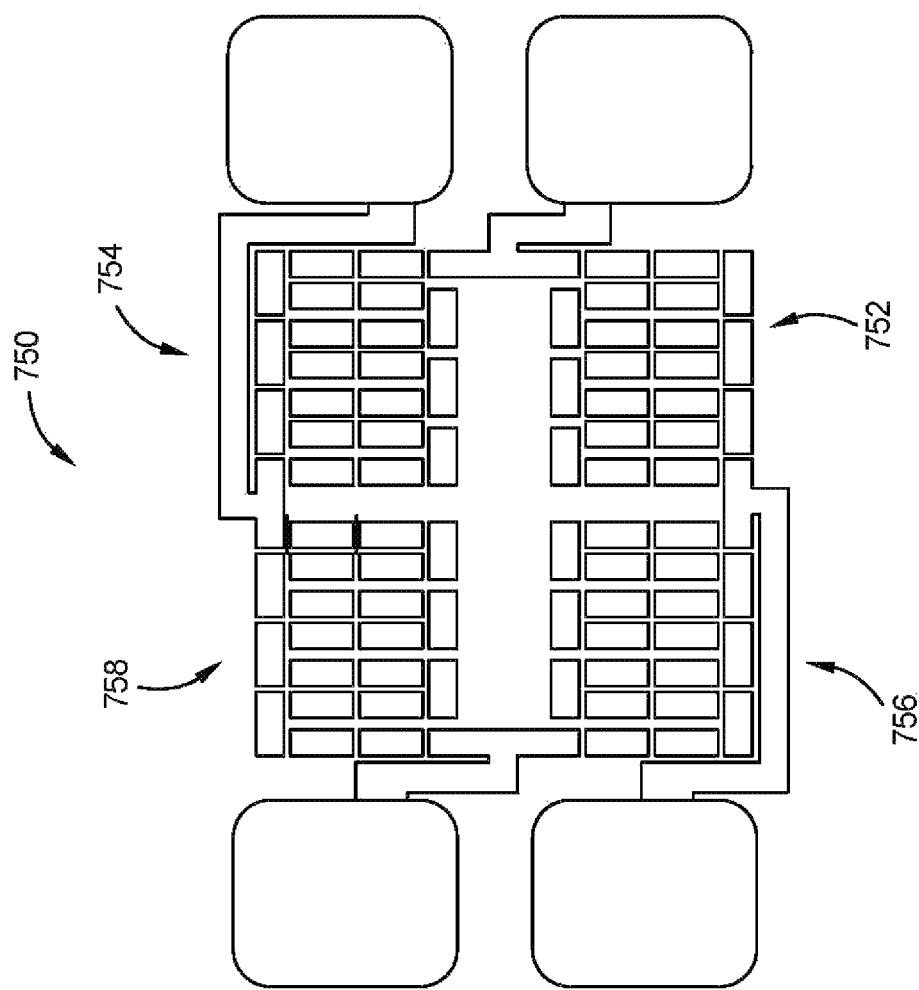

MAGNETIC SENSOR WITH DUAL TMR FILMS AND THE METHOD OF MAKING THE SAME

CROSS-REFERENCE TO RELATED APPLICATIONS

This application claims benefit of U.S. provisional patent application Ser. No. 62/892,232, filed Aug. 27, 2019, which is herein incorporated by reference.

BACKGROUND OF THE DISCLOSURE

Field of the Disclosure

Embodiments of the present disclosure generally relate to a tunneling magnetoresistance sensor device, such as a Wheatstone bridge, and a method of fabrication thereof.

Description of the Related Art

A Wheatstone bridge is an electrical circuit used to measure the electrical resistance of an unknown component by balancing two legs of a bridge circuit, one leg of which includes the unknown component. The Wheatstone circuit provides extremely accurate measurements in comparison to a simple voltage divider.

The Wheatstone bridge has recently been employed in magnetic sensor applications. The Wheatstone bridge includes multiple resistors based on magnetic Hall effect, anisotropy magnetoresistive (AMR) effect, giant magnetoresistive (GMR) effect, and tunneling magnetoresistive (TMR) effect. The TMR based magnetic sensor has a very high sensitivity compared to other magnetic sensors.

Typical TMR based Wheatstone bridges comprise four resistors, which are made of TMR films. To enable the Wheatstone bridge characteristics for magnetic field sensing, opposite signs of resistance-field dependence are required for the first and the fourth resistors against the second and the third resistors. One way to realize this has been the fabrication of the first and the fourth resistors with stripe orientation at +45° to a designed field sensing direction and the second and the third resistors with stripe orientation at −45° to the designed field sensing direction. All four of the resistors are comprised of the same TMR material or film, and as such, the pinned layer of each of the four resistors have similar magnetization directions, designated perpendicular to the field sensing direction.

When applying a magnetic field to the Wheatstone bridge, the resistance of the first and fourth resistors increases or decreases with the applied magnetic field while the resistance of the second and third resistors decreases or increases with the applied magnetic field, realizing bridge characteristic differential output. The efficiency of a Wheatstone bridge formed as such is, however, not optimal since the full range of the magnetoresistance change is unable to be utilized in such a design due to the ±45° sensor stripe orientations, resulting in reduced output voltage or limited sensitivity.

Therefore, there is a need in the art for a magnetic sensor, and method of fabricating thereof, that operates in the full magnetoresistance range while achieving the maximum output voltage or sensitivity.

SUMMARY OF THE DISCLOSURE

A TMR sensor device is disclosed that includes four or more TMR resistors. The TMR sensor device comprises a first TMR resistor comprising a first TMR film, a second TMR resistor comprising a second TMR film different than the first TMR film, a third TMR resistor comprising the second TMR film, and a fourth TMR resistor comprising the first TMR film. The first, second, third, and fourth TMR resistors are disposed in the same plane. The first TMR film comprises a synthetic anti-ferromagnetic pinned layer having a magnetization direction of the reference layer orthogonal to a free layer. The second TMR film comprises a double synthetic anti-ferromagnetic pinned layer having a magnetization direction of the reference layer orthogonal to the magnetization of a free layer, but opposite to the magnetization direction of the reference layer of the first TMR film.

In one embodiment, a TMR sensor device comprises a first TMR resistor comprising a first TMR film, the first TMR film comprising a synthetic anti-ferromagnetic pinned layer having a magnetization direction of a first reference layer orthogonal to a first free layer, a second TMR resistor comprising a second TMR film, the second TMR film comprising a double synthetic anti-ferromagnetic pinned layer having a magnetization direction of a second reference layer orthogonal to a second free layer and opposite to a magnetization direction of the first reference layer of the first TMR film, a third TMR resistor comprising the second TMR film, and a fourth TMR resistor comprising the first TMR film, wherein the first, second, third, and fourth TMR resistors are disposed in a same plane.

In another embodiment, a method of fabricating a TMR sensor device comprises forming one or more bottom leads, depositing a first TMR film over at least a first bottom lead and a second bottom lead, removing a first portion of the first TMR film disposed above the second bottom lead, depositing a second TMR film over the first TMR film and the second bottom lead, the second TMR film being different than the first TMR film, and removing a first portion of the second TMR film disposed over the first TMR film.

In another embodiment, a method of fabricating a TMR sensor device comprises forming one or more bottom leads, depositing a first TMR film over the one or more bottom leads, the first TMR film comprising a synthetic anti-ferromagnetic pinned layer having a magnetization direction of a first reference layer orthogonal to a first free layer, depositing a first photoresist over a first portion of the first TMR film and at least a first bottom lead, etching a second portion of the first TMR film to expose at least a second bottom lead, removing the first photoresist, depositing a second TMR film over the first TMR film and the second bottom lead, the second TMR film comprising a double synthetic anti-ferromagnetic pinned layer having a magnetization direction of a second reference layer orthogonal to a magnetization direction of a second free layer and opposite to the magnetization direction of the first reference layer of the first TMR film, depositing a second photoresist over a first portion of the second TMR film and the second bottom lead, etching a second portion of the second TMR film to expose the first TMR film, and removing the second photoresist.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not

FIGS. 6A-6H illustrate a corresponding schematic of depositing a first TMR film to function as a first resistor and a fourth resistor and a second TMR film to function as a second resistor and a third resistor of a TMR sensor device or Wheatstone bridge, according to another embodiment.

FIG. 7B illustrates four TMR resistor arrays, according to one embodiment.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

A tunneling magnetoresistance (TMR) sensor device is disclosed that includes four or more TMR resistors. The TMR sensor device comprises a first TMR resistor comprising a first TMR film, a second TMR resistor comprising a second TMR film different than the first TMR film, a third TMR resistor comprising the second TMR film, and a fourth TMR resistor comprising the first TMR film. The first, second, third, and fourth TMR resistors are disposed in the same plane. The first TMR film comprises a synthetic anti-ferromagnetic pinned layer having a magnetization direction of the reference layer orthogonal to a free layer. The second TMR film comprises a double synthetic anti-ferromagnetic pinned layer having a magnetization direction of the reference layer orthogonal to the magnetization of a free layer, but opposite to the magnetization direction of the reference layer of the first TMR film.

Figure 1:
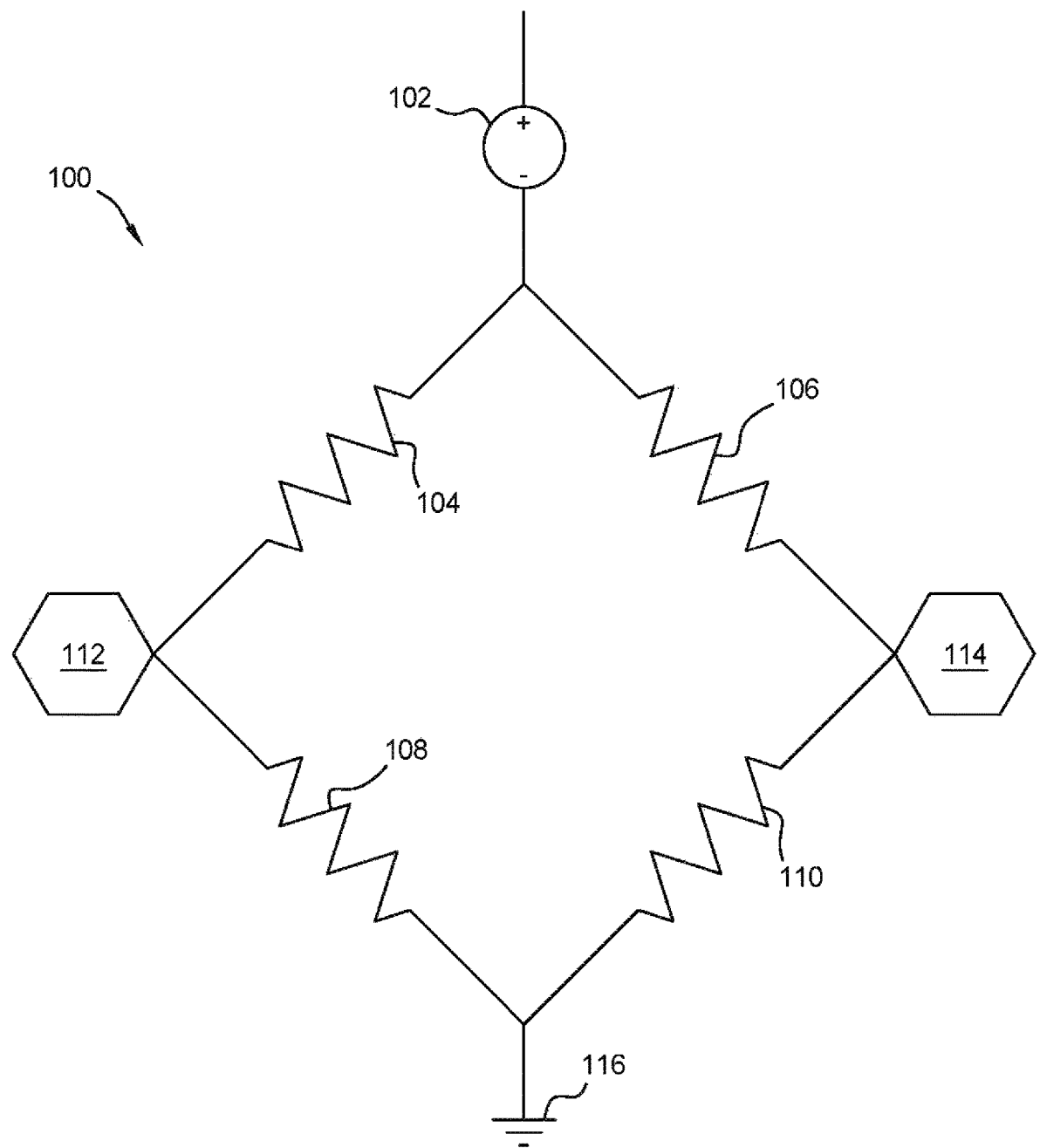
FIG. 1 is a schematic illustration of a TMR sensor device or Wheatstone bridge design.

FIG. 1 is a schematic illustration of a TMR sensor device 100 design, such as a Wheatstone bridge. The TMR sensor device 100 includes a bias source 102, a first resistor 104, a second resistor 106, a third resistor 108, a fourth resistor 110, a first output pad 112, a second output pad 114, and a ground connection 116. The resistors 104, 106, 108, 110 are formed by patterning TMR films. The resistors 104, 106, 108, 110 are formed by magnetic sensors. Bias voltage is applied across the TMR sensor device 100 or bridge from the bias source 102 to the ground connection 116. The bridge output is the potential difference across the first output pad 112 and the second output pad 114. Any change in resistance due to temperature variation from the resistors 104, 106, 108, 110 is nullified due to the nature of the differential output.

As discussed herein, each of the resistors 104, 106, 108, 110 is made of a TMR film. In one embodiment, the TMR resistors are each distinct and different such that the resistors 104, 106, 108, 110 have different resistance. In another embodiment, the TMR films are identical, but the resistors 104, 106, 108, 110 are different. In still another embodiment, resistors 104, 110 are identical to each other (as are the TMR films that form the resistors 104, 110), and resistors 106, 108 are identical to each other (as are the TMR films that form the resistors 106, 108) yet different than resistors 104, 110.

Figure 2:
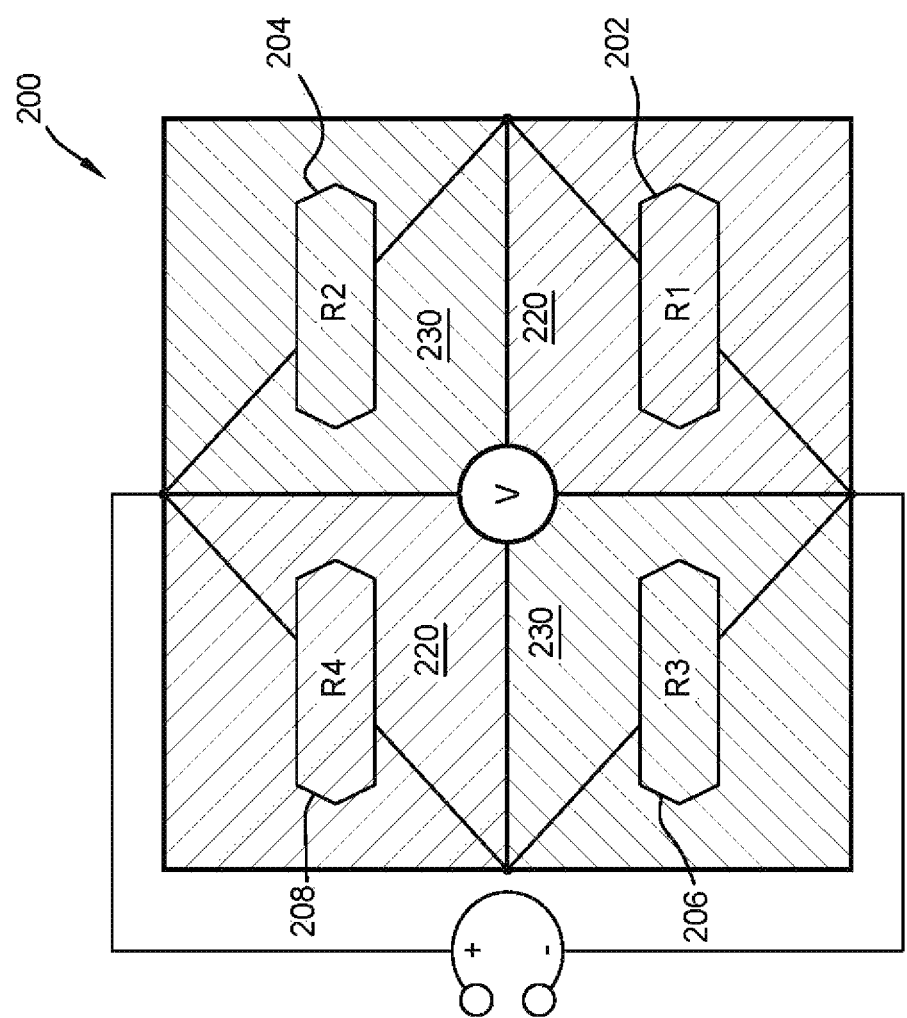
FIG. 2 is a schematic view illustrating a first TMR film and a second TMR film used to form resistors of a TMR sensor device or Wheatstone bridge, according to one embodiment.

FIG. 2 is a schematic view illustrating a first TMR film 220, or film A, and a second TMR film 230, or film B, used to form TMR resistors 202, 204, 206, 208 of a TMR sensor device 200, such as a TMR based magnetic sensor or Wheatstone bridge, according to one embodiment. The TMR sensor device 200 may be the TMR sensor device 100 of FIG. 1.

As shown in FIG. 2, a first resistor R1 202 and a fourth resistor R4 208 both comprise the first TMR film 220 while a second resistor R2 204 and a third resistor R3 206 both comprise the second TMR film 230. The TMR resistance of the first and fourth resistors R1/R4 202, 208 formed of the first TMR film 220 increase with an external magnetic field while the TMR resistance of the second and third resistors R2/R3 204, 206 formed of the second TMR film 230 decrease with an external magnetic field. Alternatively, the TMR resistance of the first and fourth resistors R1/R4 202, 208 formed of the first TMR film 220 may decrease with an external magnetic field while the TMR resistance of the second and third resistors R2/R3 204, 206 formed of the second TMR film 230 may increase with an external magnetic field. As such, the two different TMR films 220, 230 provide two different magnetoresistance responses.

Figure 3:
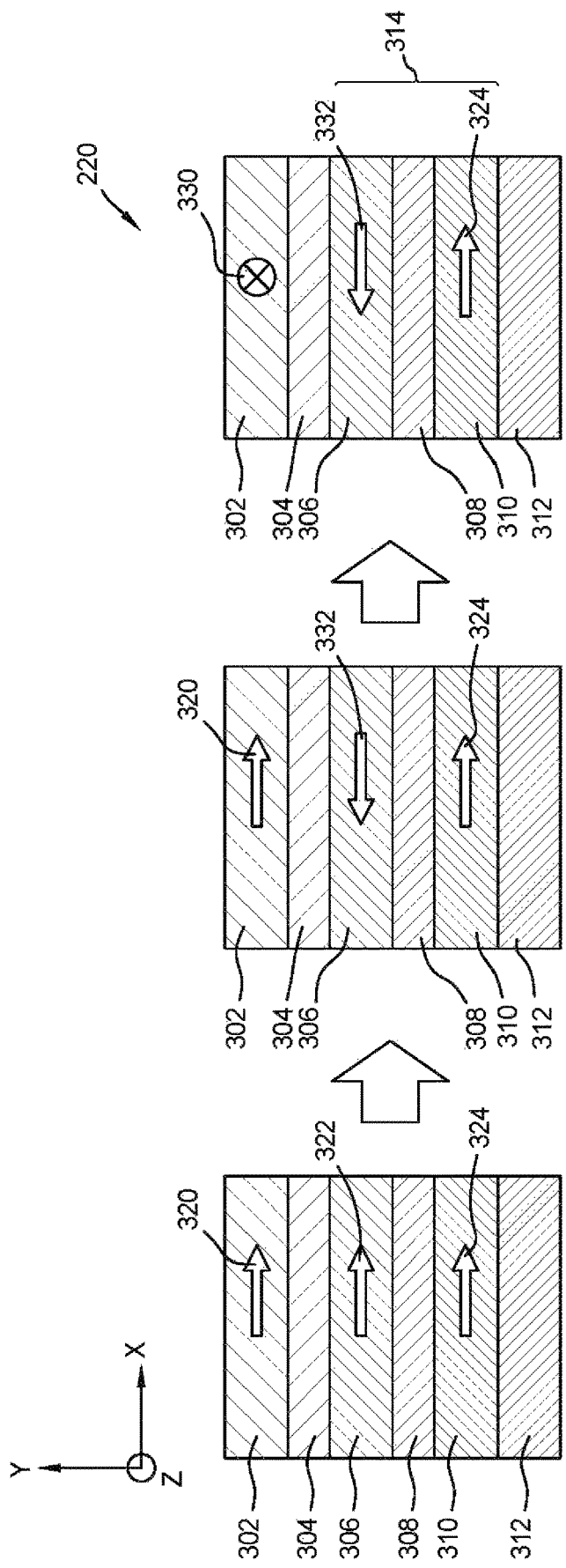
FIGS. 3A-3C illustrate a first TMR film, or TMR film A, in various stages of formation, according to one embodiment.

FIGS. 3A-3C illustrate the first TMR film 220 of FIG. 2, or film A, in various stages of formation, according to one embodiment. FIG. 3A illustrates the first TMR film 220 during a magnetic anneal, FIG. 3B illustrates the first TMR film 220 post magnetic anneal, and FIG. 3C illustrates the first TMR film 220 after the FL magnetization direction has been reset upon completion of the TMR sensor device or Wheatstone bridge fabrication. The first TMR film 220 may function as magnetic sensors.

In FIGS. 3A-3C, the first TMR film 220 comprises a free layer 302, a barrier layer 304 disposed below the free layer 302, a reference layer (RL) 306 disposed below the barrier layer 304, a spacer layer 308 disposed below the RL 306, a pinned layer (PL) 310 disposed below the spacer layer 308, and an antiferromagnet (AFM) layer 312 disposed below the PL 310.

The FL 302 may comprise a CoFe/CoFeB/Ta/NiFe multilayer stack. Suitable materials for the free layer 302 include a CoFe/CoFeB/Ta/NiFe multilayer stack. The CoFe layer may have a thickness of between about 3 Angstroms to about 10 Angstroms. The CoFeB layer may have a thickness of between about 10 Angstroms to about 20 Angstroms. The Ta layer may have a thickness of between about 0.5 Angstroms to about 2 Angstroms. The NiFe layer may have a thickness of between about 3 Angstroms to about 300 Angstroms, such as between about 3 Angstroms and about 10 Angstroms or between about 10 Angstroms and about 300 Angstroms. The free layer 302 may be formed by well-known deposition methods such as sputtering. Additionally, it is to be understood that while CoFe/CoFeB/Ta/NiFe has been exemplified as the free layer 302 material, other materials are contemplated and the embodiments discussed herein are not limited to CoFe/CoFeB/Ta/NiFe for the free layer 302.

The barrier layer 304 may comprise MgO and may have a thickness of between about 10 Angstroms to about 20 Angstroms. It is to be understood that while MgO is exemplified as the barrier layer 304, other insulating materials as contemplated. The spacer layer 308 comprises a non-magnetic material, such as Ru. The spacer layer 308 may have a thickness of between about 4 Angstroms to about 10 Angstroms. The spacer layer 308 may be formed by well-known deposition methods such as sputtering. Additionally, it is to be understood that while ruthenium has been exemplified as the spacer layer 308 material, other materials are contemplated and the embodiments discussed herein are not limited to ruthenium for the spacer layer 308.

Suitable materials for the reference layer 306 and the pinned layer 310 include CoFe or a Co/CoFe/Co multi-layer stack with a thickness of between about 20 Angstroms and about 30 Angstroms. The reference layer 306 and the pinned layer 310 may be formed by well-known deposition methods such as sputtering. The reference layer 306 and the pinned layer 310 can each include a CoFe/Ta/CoFeB/CoFe multilayer. Additionally, it is to be understood that while CoFe or Co/CoFe/Co have been exemplified as the reference layer 306 and the pinned layer 310 material, other materials are contemplated and the embodiments discussed herein are not limited to CoFe or Co/CoFe/Co for the reference layer 306 and the pinned layer 310.

Suitable materials for the AFM layer 312 include IrMn, PtMn, PdMn, or NiMn at a thickness of between about 40 Angstroms to about 500 Angstroms. The AFM layer 312 may be formed by well-known deposition methods such as sputtering. Additionally, it is to be understood that while IrMn, PtMn, PdMn, or NiMn have been exemplified as the AFM layer 312 materials, other materials are contemplated and the embodiments discussed herein are not limited to IrMn, PtMn, PdMn, or NiMn for the AFM layer 312.

In FIG. 3A, the FL 302 has a first magnetization direction 320 pointing in the x-direction, the RL 306 has a first magnetization direction 322 pointing in the x-direction, and the PL 310 has a first magnetization direction 324 pointing in the x-direction during magnetic annealing under a magnetic field applied along the x-direction.

In FIG. 3B, the FL 302 has the first magnetization direction 320 pointing in the x-direction, the RL 306 has a second magnetization direction 332 pointing in the −x-direction due to the Ruderman-Kittel-Kasuya-Yosida (RKKY) interlayer exchange coupling effect while the PL 310 disposed adjacent to the AFM layer 312 has the first magnetization direction 324 pointing in the x-direction. Thus, post magnetic anneal, the FL 302 and the PL 310 have parallel magnetization directions 320, 324 while the RL 306 has an anti-parallel magnetization direction 332.

In FIG. 3C, the FL 302 has a second magnetization direction 330 pointing in the −z-direction (i.e., into the page), the RL 306 has the second magnetization direction 332 pointing in the −x-direction, and the PL 310 has a first magnetization direction 324 pointing in the x-direction. Thus, after the FL magnetization direction has been reset upon completion of the TMR sensor device or Wheatstone bridge fabrication, the FL 302 has an orthogonal magnetization direction 330 to that of the RL 306 and the PL 310 while the RL 306 has a magnetization direction 332 anti-parallel to the PL 310 magnetization direction 324. The magnetization direction 330 of the FL 302 may be reset by applying an additional magnetic field like hard bias by a permanent magnet around the FL 302 or exchange bias by an AFM on top of the FL 302.

FIG. 3C illustrates the first TMR film 220 used in the TMR sensor device 200 of FIG. 2. As further shown in FIG. 3C, the RL 306 and the PL 310 form a synthetic anti-ferromagnetic (SAF) pinned layer 314.

Figure 4:
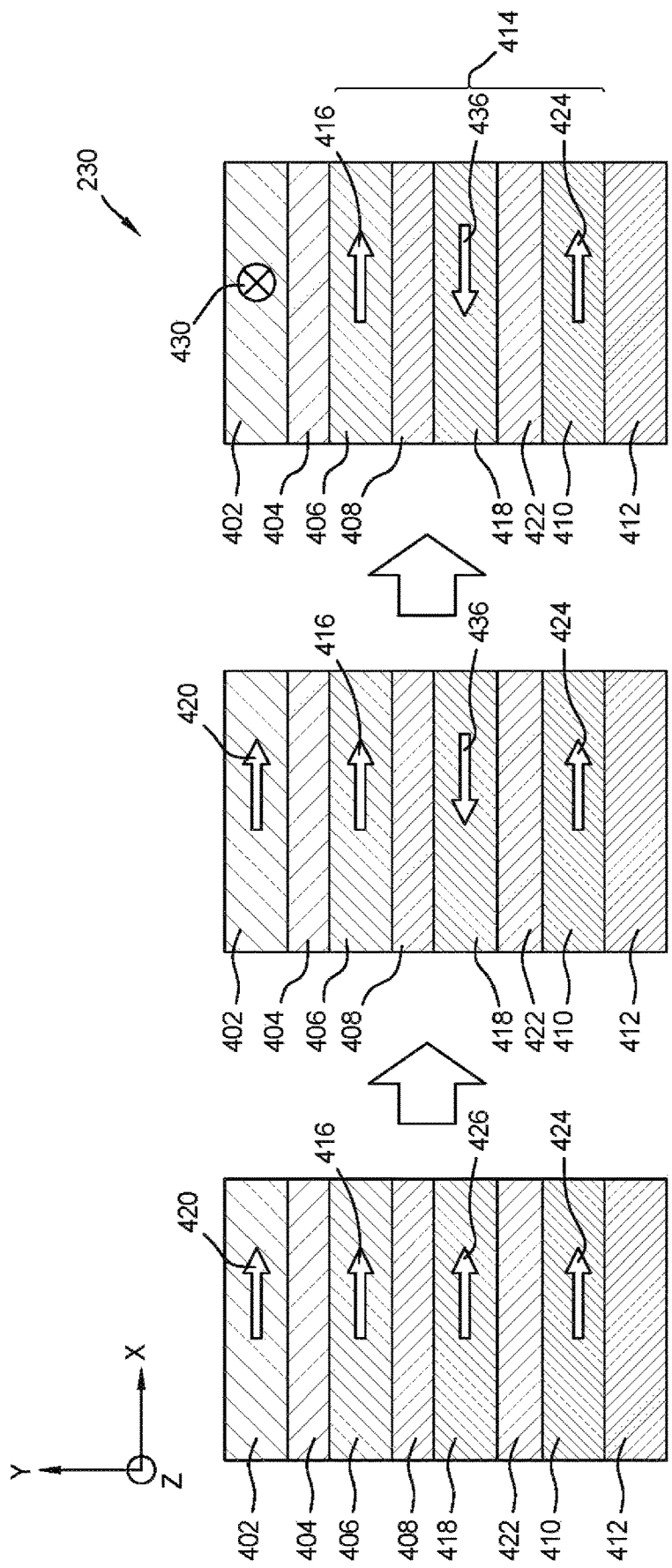
FIGS. 4A-4C illustrate a second TMR film, or TMR film B, in various stages of formation, according to another embodiment.

FIGS. 4A-4C illustrate the second TMR film 230 of FIG. 2, or film B, in various stages of formation, according to one embodiment. FIG. 4A illustrates the second TMR film 230 during a magnetic anneal, FIG. 4B illustrates the second TMR film 230 post magnetic anneal, and FIG. 4C illustrates the second TMR film 230 after the FL magnetization direction has been reset upon completion of the TMR sensor device or Wheatstone bridge fabrication. The second TMR film 230 may function as magnetic sensors.

In FIGS. 4A-4C, the second TMR film 230 comprises a free layer 402, a barrier layer 404 disposed below the free layer 402, a reference layer (RL) 406 disposed below the barrier layer 404, a first spacer layer 408 disposed below the RL 406, a first pinned layer (PL') 418 disposed below the first spacer layer 408, a second spacer layer 422 disposed below the first PL' 418, a second pinned layer (PL") 410 disposed below the second spacer layer 422, and an AFM layer 412 disposed below the second PL" 410.

The FL 402 may comprise a CoFe/CoFeB/Ta/NiFe multilayer stack. Suitable materials for the free layer 402 include a CoFe/CoFeB/Ta/NiFe multilayer stack. The CoFe layer may have a thickness of between about 3 Angstroms to about 10 Angstroms. The CoFeB layer may have a thickness of between about 10 Angstroms to about 20 Angstroms. The Ta layer may have a thickness of between about 0.5 Angstroms to about 2 Angstroms. The NiFe layer may have a thickness of between about 3 Angstroms to about 300 Angstroms, such as between about 3 Angstroms and about 10 Angstroms or between about 10 Angstroms and about 300 Angstroms. The free layer 402 may be formed by well-known deposition methods such as sputtering. Additionally, it is to be understood that while CoFe/CoFeB/Ta/NiFe has been exemplified as the free layer 402 material, other materials are contemplated and the embodiments discussed herein are not limited to CoFe/CoFeB/Ta/NiFe for the free layer 402.

The barrier layer 404 may comprise MgO and may have a thickness of between about 10 Angstroms to about 20 Angstroms. It is to be understood that while MgO is exemplified as the barrier layer 404, other insulating materials as contemplated. The first and second spacer layers 408, 422 may each comprise a non-magnetic material, such as Ru. The first and second spacer layers 408, 422 may each have a thickness of between about 4 Angstroms to about 10 Angstroms. The first and second spacer layers 408, 422 may be formed by well-known deposition methods such as sputtering. Additionally, it is to be understood that while ruthenium has been exemplified as the first and second spacer layers 408, 422 material, other materials are contemplated and the embodiments discussed herein are not limited to ruthenium for the first and second spacer layers 408, 422.

Suitable materials for the reference layer 406 and the first and second pinned layers 410, 418 include CoFe or a Co/CoFe/Co multi-layer stack with a thickness of between about 20 Angstroms and about 30 Angstroms. The reference layer 406 and the first and second pinned layers 410, 418 may be formed by well-known deposition methods such as sputtering. The reference layer 406 can include a CoFe/Ta/CoFeB/CoFe multilayer. Additionally, it is to be understood that while CoFe or Co/CoFe/Co have been exemplified as the reference layer 406 and the first and second pinned layers 410, 418 material, other materials are contemplated and the embodiments discussed herein are not limited to CoFe or Co/CoFe/Co for the reference layer 406 and the first and second pinned layers 410, 418.

Suitable materials for the AFM layer 412 include IrMn, PtMn, PdMn, or NiMn at a thickness of between about 40 Angstroms to about 500 Angstroms. The AFM layer 412 may be formed by well-known deposition methods such as sputtering. Additionally, it is to be understood that while IrMn, PtMn, PdMn, or NiMn have been exemplified as the AFM layer 412 materials, other materials are contemplated and the embodiments discussed herein are not limited to IrMn, PtMn, PdMn, or NiMn for the AFM layer 412.

In FIG. 4A, the FL 402 has a first magnetization direction 420 pointing in the x-direction, the RL 406 has a first magnetization direction 416 pointing in the x-direction, the second PL" 410 has a first magnetization direction 424 pointing in the x-direction, and the first PL' 418 has a first magnetization direction 426 pointing in the x-direction during magnetic annealing under a magnetic field applied along x-direction. Thus, the second TMR film 230 has the magnetization directions of the FL 402, the RL 406, the second PL" 410, and the first PL' 418 parallel to one another.

In FIG. 4B, the FL 402 has the first magnetization direction 420 pointing in the x-direction, the RL 406 has the first magnetization direction 416 pointing in the x-direction, the second PL" 410 has the first magnetization direction 424 pointing in the x-direction, and the first PL' 418 has a second magnetization direction 436 pointing in the –x-direction due to the RKKY interlayer exchange coupling effect. The second PL" 410 disposed adjacent to the AFM 412 has a magnetization direction 424 parallel to the annealing magnetic field setting the AFM exchange bias or unidirectional anisotropy direction. Thus, post magnetic annealing, the FL 402, the RL 406, and the second PL" 410 have parallel magnetization directions 420, 422, 424 while the first PL' 418 has an anti-parallel magnetization direction 436.

In FIG. 4C, the FL 402 has a second magnetization direction 430 pointing in the –z-direction (i.e., into the page), the RL 406 has the first magnetization direction 416 pointing in the x-direction, the second PL" 410 has a first magnetization direction 424 pointing in the x-direction, and the first PL' 418 has the second magnetization 436 pointing in the –x-direction. Thus, after the FL magnetization direction has been reset upon completion of the TMR sensor device or Wheatstone bridge fabrication, the FL 402 has an orthogonal magnetization direction 430 to that of the RL 406 and the second PL" 410 while the first PL' 418 has a magnetization direction 436 anti-parallel to that of the RL 406 and the second PL" 410. The magnetization direction 430 of the FL 402 may be reset by applying an additional magnetic field like hard bias by a permanent magnetic around the FL 402 or the exchange bias by an AFM on top of the FL 402.

FIG. 4C illustrates the second TMR film 230 used in the TMR sensor device 200 of FIG. 2. As further shown in FIG. 4C, the RL 406, the second PL" 410, and the first PL' 418 form a double SAF pinned layer 414. Because the first TMR film 220 and the second TMR film 230 have different RL magnetization directions, the TMR resistance response of each film has the same amplitude but in opposite sense (i.e., the resistance of one film increases with increasing magnetic field while the resistance of the other film decreases, or vice versa). As such, the TMR sensor device or Wheatstone bridge characteristic differential output is realized and fulfilled with maximum efficiency since the full range of magnetoresistance range is available, accomplishing maximum output voltage or sensitivity.

Figure 5:
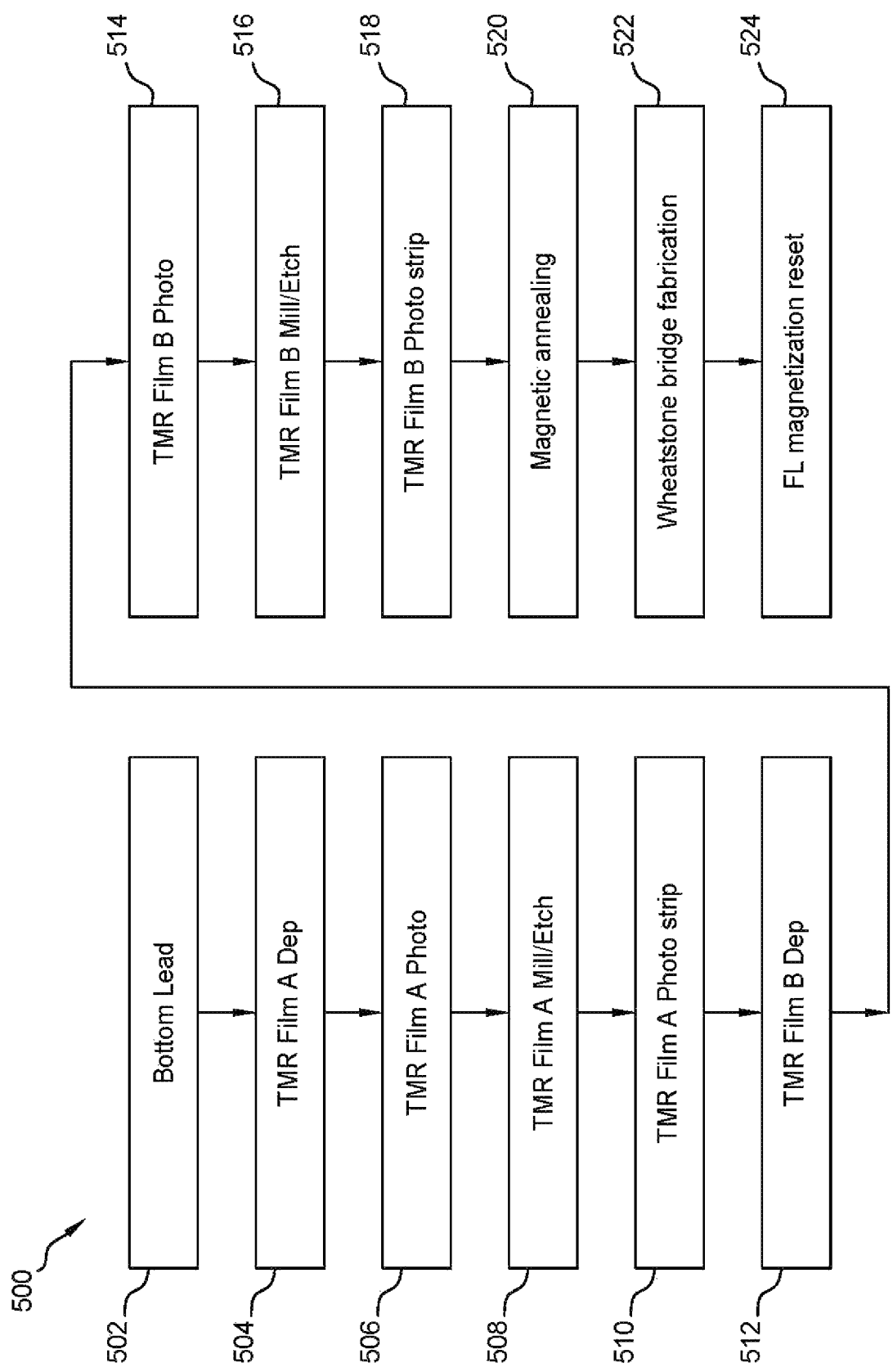
FIG. 5 illustrates a method of forming a TMR sensor device or Wheatstone bridge, according to one embodiment.

FIG. 5 illustrates a method 500 of forming a TMR sensor device, such as a TMR magnetic sensor or Wheatstone bridge, by depositing a first film to function as a first resistor and a fourth resistor and a second film to function as a second resistor and a third resistor, according to embodiments disclosed herein. FIGS. 6A-6H illustrate a corresponding schematic of depositing a first TMR film 610 to function as a first resistor and a fourth resistor and a second TMR film 618 to function as a second resistor and a third resistor of a TMR sensor device 600, such as a TMR magnetic sensor or Wheatstone bridge. FIG. 5 will be described with reference to FIGS. 6A-6H.

In operation 502, one or more bottom leads 604 (a first bottom lead 604a and a second bottom lead 604b are shown) and a dielectric layer 606 are formed over a substrate 602, and a chemical-mechanical planarization (CMP) stop layer 608 is deposited on the dielectric layer 606. The one or more bottom leads 604 may undergo a CMP process to reduce a surface roughness of the bottom leads 604.

In one embodiment, four bottom leads 604 are formed. In such an embodiment, a third bottom lead (not shown) may be disposed behind the first bottom lead 604a in the z-direction, and a fourth bottom lead (not shown) may be disposed behind the second bottom lead 604b in the z-direction. While only a first bottom lead 604a and a second bottom lead 604b are shown, one or more bottom leads 604 may be included.

Figure 6A:
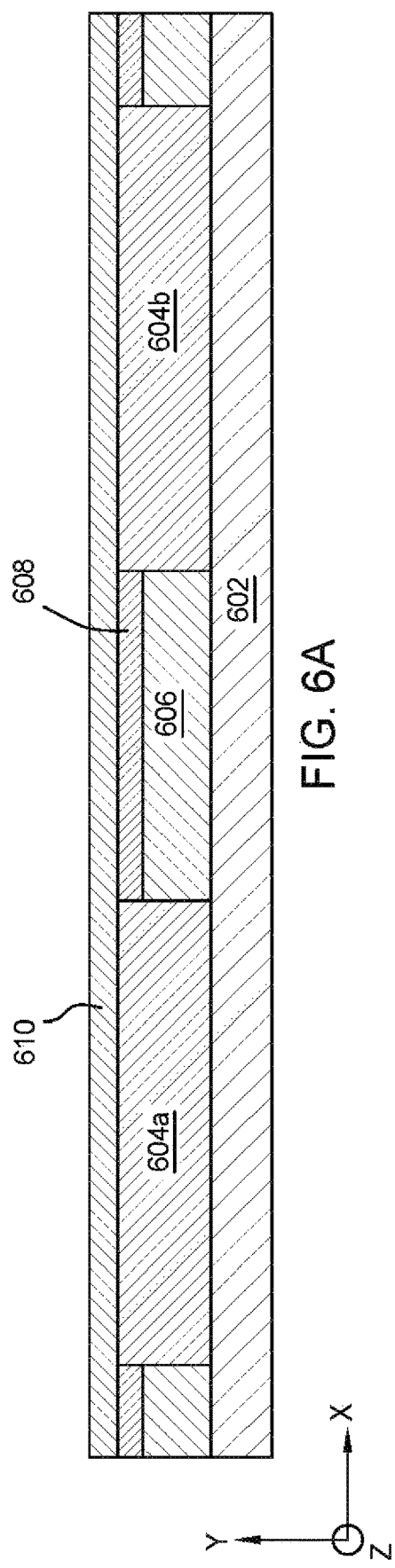

In operation 504, a first TMR film 610, or TMR film A, is deposited over both the first and second bottom leads 604a, 604b, as shown as a single layer in FIG. 6A. The first TMR film 610 comprises a plurality of layers. In some embodiments, the first TMR film 610 is the first TMR film 220 of FIGS. 2 and 3C. The first TMR film 610 comprises a synthetic anti-ferromagnetic pinned layer.

Figure 6B:
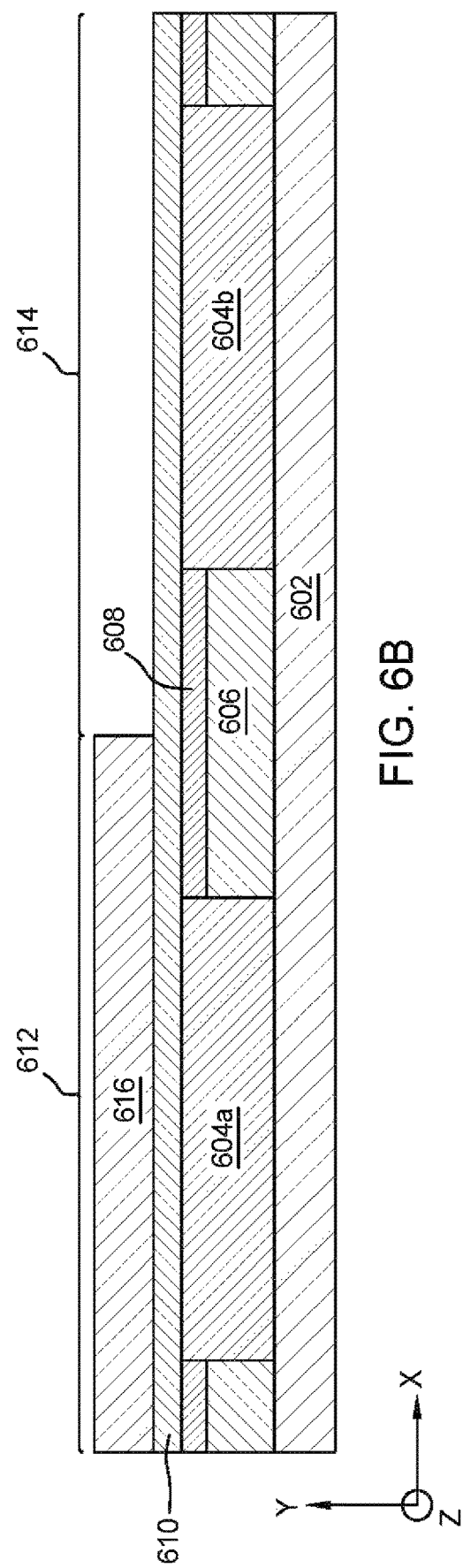

In operation 506, a first photoresist 616 is deposited over a first portion 612 of the first TMR film 610, as shown in FIG. 6B. The length and width of the first photoresist 616 in the x-direction and z-direction is selected to define the length and width of a first resistor and a fourth resistor (described below) in the x-direction and z-direction. The first portion 612 is disposed above the first bottom lead 604a. A second portion 614 of the first TMR film 610 is disposed above the second bottom lead 604b. The first photoresist 616 has a width greater than the first bottom lead 604a.

In operation 508, the first TMR film 610 disposed in the second portion 614 is milled away with accurate control such that no first TMR film 610 remains disposed above the second bottom lead 604b, and without removing the second bottom lead 604b, as shown in FIG. 6C. The first TMR film 610 disposed in the first portion 612 is protected by the first photoresist 616. In operation 510, the first photoresist 616 is stripped away and removed, as shown in FIG. 6D. Thus, the second bottom lead 604b is exposed in the second portion 614 while the first TMR film 610 is exposed in the first portion 612. The remaining first TMR film 610 has the same length and width as the first photoresist 616 in the x-direction and z-direction. The remaining first TMR film 610 a forms first resistor and a fourth resistor.

In operation 512, a second TMR film 618, or TMR film B, is deposited over the first TMR film 610 and the second bottom lead 604b, as shown as a single layer in FIG. 6E without involvement of a photoresist or a mask to protect the remaining first TMR film 610. The second TMR film 618 comprises a plurality of layers. In some embodiments, the second TMR film 618 is the second TMR film 230 of FIGS. 2 and 4C. The second TMR film 618 comprises a double synthetic anti-ferromagnetic pinned layer.

In operation 514, a second photoresist 624 is deposited over a third portion 620 of the second TMR film 618, as shown in FIG. 6F. The length and width of the second photoresist 624 in the x-direction and z-direction is selected to define the length and width of a second resistor and a third resistor (described below) in the x-direction and the z-direction. The second photoresist 624 may have the same length and width as the first photoresist 616 in the x-direction and z-direction. The third portion 620 is disposed above the second bottom lead 604b. A fourth portion 622 of the second TMR film 618 is disposed above the first bottom lead 604a and the first TMR film 610. The second photoresists 624 has a width greater than the second bottom lead 604b in the x-direction.

The third portion 620 may overlap with the second portion 614, and the third portion 620 may have a length less than the second portion 614 in the x-direction, as shown in FIG. 6F. The fourth portion 622 may overlap with the first portion 612, and the fourth portion 622 may have a length greater than the first portion 612 in the x-direction, as shown in FIG. 6F.

Figure 6G:
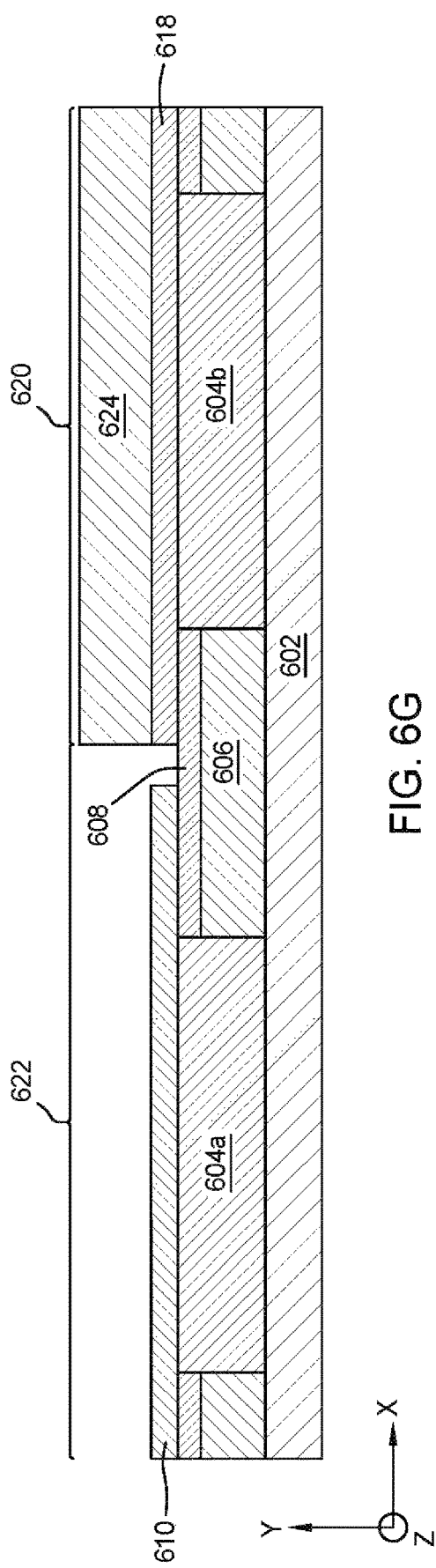
Figure 6H:
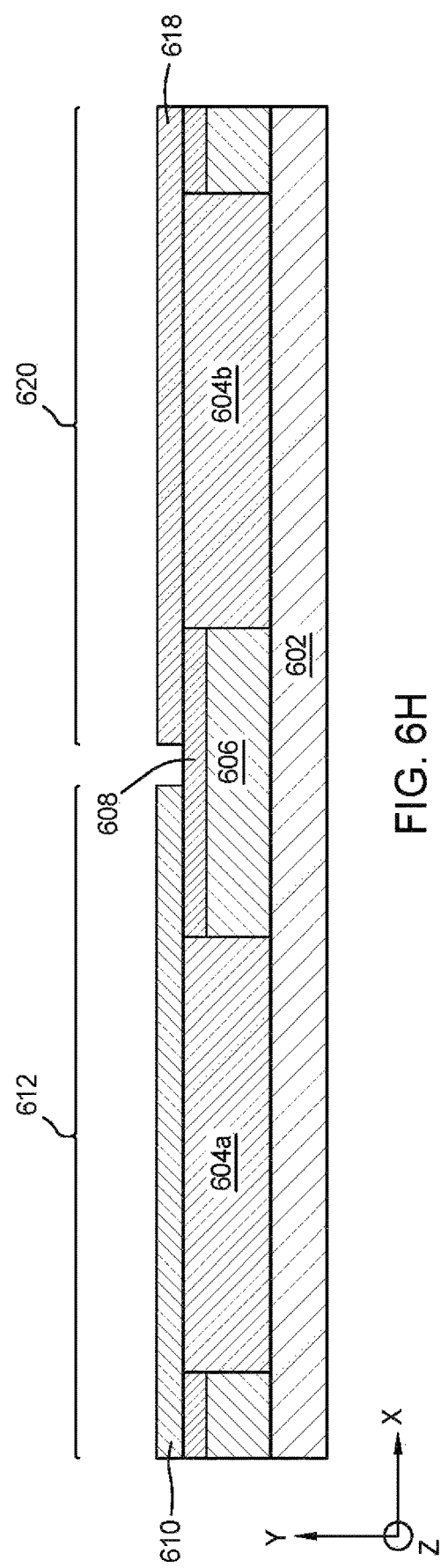

In operation 516, the second TMR film 618 disposed in the fourth portion 622 is milled away with accurate control such that no second TMR film 618 remains disposed above the first bottom lead 604a, and without removing the first TMR film 610, as shown in FIG. 6G. The second TMR film 618 disposed in the third portion 620 is protected by the second photoresist 624. In operation 518, the second photoresist 624 is stripped away and removed, as shown in FIG. 6H. The remaining second TMR film 618 has the same length and width in the x-direction and z-direction as the second photoresist 624. The remaining second TMR film 618 forms second resistor and a third resistor.

Because the third portion 620 may have the same length and width as the first portion 612, or because the second photoresist 624 may have the same length and width as the first photoresist 616, the remaining first TMR film 610 may have the same length and width in the x-direction and y-direction as the second TMR film 618. The first TMR film 610 and the second TMR film 618 may have the same length, width, and height in the x-direction, y-direction, and z-direction. Thus, the first TMR film 610 and the second TMR film 618 may be equal in size.

Following the removal of the second photoresist 624, the first TMR film 610 is exposed in the first portion 612 over the first bottom lead 604a while the second TMR film 618 is exposed in the third portion 620 over the second bottom lead 604b, as shown in FIG. 6H. The first TMR film 610 is aligned with or disposed in the same plane as the second TMR film 618. The first TMR film 610 is spaced from the second TMR film 618. In one embodiment, the second TMR film 618 is deposited in operation 504 to form the first and fourth resistors, and the first TMR film 610 is deposited in operation 512 to form the second and third resistors.

In operation 520, the first TMR film 610 and the second TMR film 618 are annealed under a magnetic field. The first TMR film 610 and the second TMR film 618 may be annealed in a magnetic oven at a temperature between about 250 degrees Celsius and about 300 degrees Celsius under a magnetic field of between about 1 Tesla to about 5 Tesla.

In operation 522, the TMR sensor device 600, (i.e., a Wheatstone bridge or TMR magnetic sensor) is fabricated. The fabrication of the TMR sensor device 600 may comprise pattern formation of the four resistors with designed geometries or shapes. Top leads (not shown) are thereafter formed over the first resistor and the fourth resistor comprised of the first TMR film 610 and the second resistor and the third resistor comprised of the second TMR film 618, respectively. Each of the four resistors comprises an individual bottom lead and top lead.

In operation 524, the magnetization direction of the FL of the first TMR film 610 is reset to a direction perpendicular to the magnetization direction of the RL of the first TMR film 610, and the magnetization direction of the FL of the second TMR film 618 is reset to a direction perpendicular to the magnetization direction of the RL of the second TMR film 618, like described above in FIGS. 3C and 4C.

The first TMR resistor may be the first resistor 104 of FIG. 1 or the first resistor 202 of FIG. 2. The second TMR resistor may be the second resistor 106 of FIG. 1 or the second resistor 204 of FIG. 2. The third TMR resistor may be the third resistor 108 of FIG. 1 or the third resistor 206 of FIG. 2. The fourth TMR resistor may be the fourth resistor 110 of FIG. 1 or the fourth resistor 208 of FIG. 2.

Figure 7A:
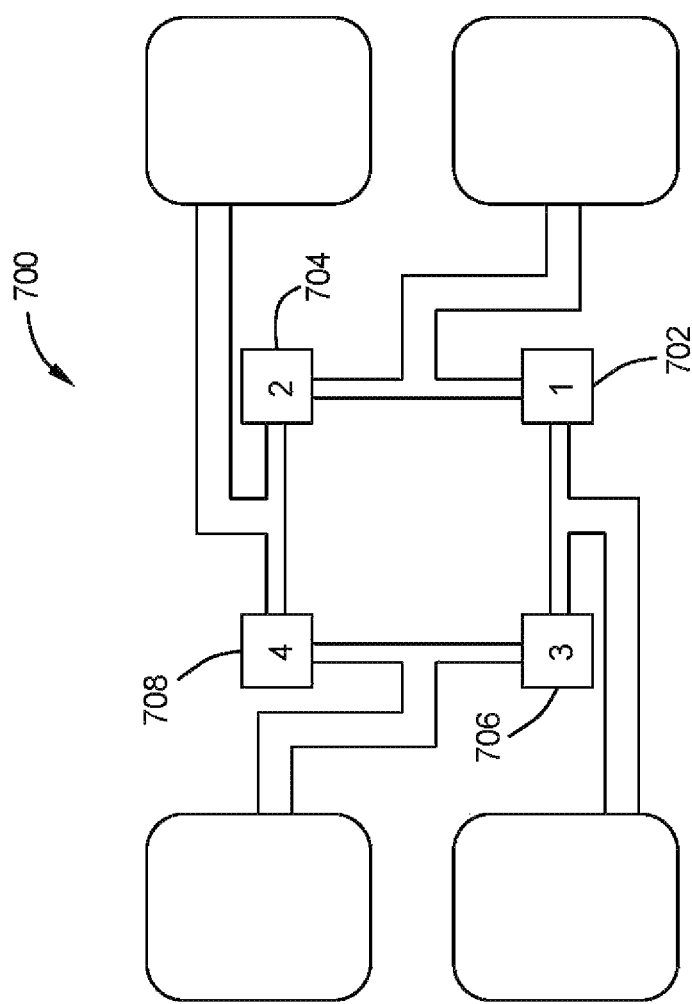
FIG. 7A illustrates a TMR sensor device or Wheatstone bridge comprising four TMR resistors, according to another embodiment.

FIG. 7A illustrates a TMR sensor device 700, such as a Wheatstone bridge, comprising four TMR resistors 702, 704, 706, 708, according to another embodiment. FIG. 7B illustrates a TMR sensor device 750, such as a Wheatstone bridge, comprising four TMR resistor arrays 752, 754, 756, 758, according to one embodiment. The TMR sensor devices 700, 750 may be formed using method 500.

In the TMR sensor device 700, the first resistor 702 and the fourth resistor 708 comprise the first TMR film 220 while the second resistor 704 and the third resistor 706 comprise the second TMR film 230. The first TMR resistor 702 may be the first resistor 104 of FIG. 1 or the first resistor 202 of FIG. 2. The second TMR resistor 704 may be the second resistor 106 of FIG. 1 or the second resistor 204 of FIG. 2. The third TMR resistor 706 may be the third resistor 108 of FIG. 1 or the third resistor 206 of FIG. 2. The fourth TMR resistor 708 may be the fourth resistor 110 of FIG. 1 or the fourth resistor 208 of FIG. 2.

The TMR sensor device 750 comprises a first resistor array 752, a second resistor array 754, a third resistor array 756, and a fourth resistor array 758. Each of the resistor arrays 752, 754, 756, 758 comprises a plurality of resistors coupled in series. To form the TMR sensor device 750, the method further includes pattern formation of four resistor arrays 752, 754, 756, 758 with designated geometries, shape, and number of resistors in series, forming top leads over the two resistor arrays with resistors in series made of the first TMR film to form a first resistor array 752 and a fourth resistor array 758, and forming top leads over the two resistor arrays with resistors in series made of the second TMR film to form the second resistor array 754 and a third resistor array 756. Thus, each of the resistors of the first resistor array 752 and the fourth resistor array 758 is comprised of the first TMR film, and each of the resistors of the second resistor array 754 and the third resistor array 756 is comprised of the second TMR film.

The number of resistors in each of the four resistor arrays 752, 754, 756, 758 can be chosen to have an odd number of columns and even number of row so that the top leads are in direct contact with the end resistors of the arrays 752, 754, 756, 758 to avoid forming vias for the top lead contacts. The first, second, third, and fourth resistor arrays 752, 754, 756, 758 are disposed in a same plane. The first resistor array 752 is adjacent to the second resistor array 754 and the third resistor array 756, the second resistor 754 array is adjacent to the first resistor array 752 and the fourth resistor array 758, the third resistor array 756 is adjacent to the first resistor array 752 and the fourth resistor array 758, and the fourth resistor array 758 is adjacent to the second resistor array 754 and the third resistor array 756.

Therefore, utilizing the above-described TMR sensor device or Wheatstone bridge design having four resistors comprised of two different TMR films results in a magnetic sensor operating at maximum efficiency with full range of magnetoresistance, hence accomplishing maximum output voltage. By using a first TMR film for the first and fourth resistors and a second TMR film for the second and third resistors, the TMR sensor device or Wheatstone bridge characteristic differential output is realized and fulfilled with maximum sensitivity.

In one embodiment, the TMR sensor is used in a camera operating as a single axis sensor. An example of such a sensor is found in United States Patent Application Publication No.: 2019/0020822 A1, which is incorporated herein by reference. However, it is contemplated that the TMR sensor may be utilized as a two dimensional or even a three dimensional sensor. Additionally, it is contemplated that TMR sensor may be integrated and utilized in inertial measurement unit technologies other than cameras such as wearable devices, compasses, and MEMS devices. Furthermore, the TMR sensor may operate as a position sensor, a bridge angular sensor, a magnetic switch, a current sensor, or combinations thereof. The TMR sensor may be used to focus a camera such as a smart phone camera by using the TMR sensors as position and angular sensors. Also, TMR sensors have applicability in the automotive industry as switch, current, and angular sensors to replace current Hall, anisotropic magnetoresistance (AMR) and giant magnetoresistance (GMR) sensors. TMR sensors may also be used in the drones and robotics industry as position and angular sensors. Medical devices can also utilize TMR sensors for flow rate control for infusion systems and endoscope camera sensors among others. Thus, the TMR sensors discussed herein have applications well beyond smart phone cameras and thus should not be limited to use as sensors for smart phone cameras. Furthermore, TMR sensors need not be arranged in a Wheatstone bridge arrangement, but rather, may be arranged in any number of manners.

In one embodiment, a TMR sensor device comprises a first TMR resistor comprising a first TMR film, the first TMR film comprising a synthetic anti-ferromagnetic pinned layer having a magnetization direction of a first reference layer orthogonal to a first free layer, a second TMR resistor comprising a second TMR film, the second TMR film comprising a double synthetic anti-ferromagnetic pinned layer having a magnetization direction of a second reference layer orthogonal to a second free layer and opposite to the magnetization direction of the first reference layer of the first TMR resistor, a third TMR resistor comprising the second TMR film, and a fourth TMR resistor comprising the first TMR film, wherein the first, second, third, and fourth TMR resistors are disposed in a same plane.

The first TMR resistor is adjacent to the second TMR resistor and the third TMR resistor, the second TMR resistor is adjacent to the first TMR resistor and the fourth TMR resistor, the third TMR resistor is adjacent to the first TMR resistor and the fourth TMR resistor, and the fourth TMR resistor is adjacent to the second TMR resistor and the third TMR resistor. A first reference layer of the first TMR film has a magnetization direction anti-parallel to a magnetization direction of a first pinned layer of the first TMR film. The first TMR film further comprises a first barrier layer, a first spacer layer, and a first antiferromagnet layer, and wherein the first barrier layer is disposed between the first reference layer and the first free layer, the first spacer layer is disposed between the first reference layer and the first pinned layer, and the first antiferromagnet layer is disposed adjacent to the first pinned layer.

The second TMR film comprises a second reference layer, a second pinned layer, and a third pinned layer disposed between the second reference layer and the second pinned layer, the second reference layer having a magnetization direction parallel to a magnetization direction of the second pinned layer and anti-parallel to a magnetization direction of the third pinned layer. The second TMR film further comprises a second barrier layer, a second spacer layer, a third spacer layer, and a second antiferromagnet layer, and wherein the second barrier layer is disposed between the second reference layer and the second free layer, the second spacer layer is disposed between the second reference layer and the third pinned layer, the third spacer layer is disposed between the third pinned layer and the second pinned layer, and the second antiferromagnetic layer is disposed adjacent to the second pinned layer. The first reference layer of the first TMR film comprises a Co/CoFe/Co multi-layer stack having a thickness of between about 20 Angstroms and about 30 Angstroms, and wherein the second reference layer of the second TMR film comprises a Co/CoFe/Co multi-layer stack having a thickness of between about 20 Angstroms and about 30 Angstroms.

In another embodiment, a method of fabricating a TMR sensor device comprises forming one or more bottom leads, depositing a first TMR film over at least a first and a second bottom lead, removing a first portion of the first TMR film disposed above the second bottom lead, depositing a second TMR film over the first TMR film and the second bottom lead, the second TMR film being different than the first TMR film, removing a first portion of the second TMR film disposed over the first TMR film, and annealing the first TMR film and the second TMR film under a magnetic field.

The method further comprises further comprising pattern formation of a first resistor, a second resistor, a third resistor, and a fourth resistor with designated geometries or shapes, and forming first top leads over the first resistor and the fourth resistor comprising the first TMR film and second top leads over the second resistor and the fourth resistor comprising the second TMR film. The first resistor is adjacent to the second resistor and the third resistor, the second resistor is adjacent to the first resistor and the fourth resistor, the third resistor is adjacent to the first resistor and the fourth resistor, and the fourth resistor is adjacent to the second resistor and the third resistor. The first TMR film comprises a synthetic anti-ferromagnetic pinned layer having a magnetization direction of a first reference layer orthogonal to a magnetization direction of a first free layer. The second TMR film comprises a double synthetic anti-ferromagnetic pinned layer having magnetization directions orthogonal to a magnetization direction of a second free layer and opposite to the magnetization direction of the first reference layer of the first TMR film.

A first reference layer of the first TMR film has a magnetization direction anti-parallel to a magnetization direction of a first pinned layer of the first TMR film, and the second TMR film comprises a second reference layer, a second pinned layer, and a third pinned layer disposed between the second reference layer and the second pinned layer, the second reference layer having a magnetization direction parallel to a magnetization direction of the second pinned layer and anti-parallel to a magnetization direction of the third pinned layer.

In another embodiment, a method of fabricating a TMR sensor device comprises forming one or more bottom leads, depositing a first TMR film over the one or more bottom leads, the first TMR film comprising a synthetic anti-ferromagnetic pinned layer having magnetization direction of a first reference layer orthogonal to a magnetization direction of a first free layer depositing a first photoresist over a first portion of the first TMR film and at least a first bottom lead, etching a second portion of the first TMR film to expose at least a second bottom lead, removing the first photoresist, depositing a second TMR film over the first TMR film and the second bottom lead, the second TMR film comprising a double synthetic anti-ferromagnetic pinned layer having a magnetization direction of a second reference layer orthogonal to a magnetization direction of a second free layer, depositing a second photoresist over a first portion of the second TMR film and the second bottom lead, etching a second portion of the second TMR film to expose the first TMR film, and removing the second photoresist.

The method further comprises pattern formation of a first resistor, a second resistor, a third resistor, and a fourth resistor with designated geometries or shapes, and forming first top leads over the first resistor and the fourth resistor comprising the first TMR film and second top leads over the second resistor and the fourth resistor comprising the second TMR film. The first resistor and the fourth resistor are comprised of the first TMR film and the second and third resistors are comprised of the second TMR film. Each of the first, second, third, and fourth resistors is a TMR resistor or a TMR resistor array. The first, second, third, and fourth resistors are disposed in a same plane. The first resistor is adjacent to the second resistor and the third resistor, the second resistor is adjacent to the first resistor and the fourth resistor, the third resistor is adjacent to the first resistor and the fourth resistor, and the fourth resistor is adjacent to the second resistor and the third resistor. The first portion of the first TMR film and the first portion of the second TMR film are equal in size.

While the foregoing is directed to embodiments of the present disclosure, other and further embodiments of the disclosure may be devised without departing from the basic scope thereof, and the scope thereof is determined by the claims that follow.

What is claimed is:

1. A tunneling magnetoresistance (TMR) sensor device, comprising:
    a first tunneling magnetoresistance (TMR) resistor comprising a first TMR film, the first TMR film comprising a synthetic anti-ferromagnetic pinned layer having a magnetization direction of a first reference layer orthogonal to a magnetization direction of a first free layer, wherein the first TMR film of the first TMR resistor is disposed on a first bottom lead;
    a second TMR resistor comprising a second TMR film, the second TMR film comprising a double synthetic anti-ferromagnetic pinned layer having a magnetization direction of a second reference layer orthogonal to magnetization direction of a second free layer and anti-parallel to the magnetization direction of the first reference layer of the first TMR film, wherein the second TMR film of the second TMR resistor is disposed on a second bottom lead, the second bottom lead being separated from the first bottom lead by a dielectric layer;
    a third TMR resistor comprising the second TMR film; and
    a fourth TMR resistor comprising the first TMR film, wherein the first, second, third, and fourth TMR resistors are disposed in a same plane.

2. The TMR sensor device of claim 1, wherein the first TMR resistor is adjacent to the second TMR resistor and the third TMR resistor, the second TMR resistor is adjacent to the first TMR resistor and the fourth TMR resistor, the third TMR resistor is adjacent to the first TMR resistor and the fourth TMR resistor, and the fourth TMR resistor is adjacent to the second TMR resistor and the third TMR resistor.

3. The TMR sensor device of claim 1, wherein the first reference layer of the first TMR film has a magnetization direction anti-parallel to a magnetization direction of a first pinned layer of the first TMR film.

4. The TMR sensor device of claim 3, wherein the first TMR film further comprises a first barrier layer, a first spacer layer, and a first antiferromagnet layer, and wherein the first barrier layer is disposed between the first reference layer and the first free layer, the first spacer layer is disposed between the first reference layer and the first pinned layer, and the first antiferromagnet layer is disposed adjacent to the first pinned layer.

5. The TMR sensor device of claim 1, wherein the second TMR film comprises the second reference layer, a second pinned layer, and a third pinned layer disposed between the second reference layer and the second pinned layer, the second reference layer having a magnetization direction parallel to a magnetization direction of the second pinned layer and anti-parallel to a magnetization direction of the third pinned layer.

6. The TMR sensor device of claim 5, wherein the second TMR film further comprises a second barrier layer, a second spacer layer, a third spacer layer, and a second antiferromagnetic layer, and wherein the second barrier layer is disposed between the second reference layer and the second free layer, the second spacer layer is disposed between the second reference layer and the third pinned layer, the third spacer layer is disposed between the second pinned layer and the third pinned layer, and the second antiferromagnet layer is disposed adjacent to the second pinned layer.

7. The TMR sensor device of claim 1, wherein the first reference layer of the first TMR film comprises a Co/CoFe/Co multi-layer stack having a thickness of between about 20 Angstroms and about 30 Angstroms, and wherein the second reference layer of the second TMR film comprises a Co/CoFe/Co multi-layer stack having a thickness of between about 20 Angstroms and about 30 Angstroms.

8. A method of fabricating a TMR sensor device, comprising:
    forming one or more bottom leads, wherein each of the one or more bottom leads is separated from adjacent bottom leads by a dielectric layer;
    depositing a first TMR film over at least a first bottom lead, a second bottom lead, and the dielectric layer;

removing a first portion of the first TMR film disposed above the second bottom lead such that the first TMR film is disposed on the first bottom lead;

depositing a second TMR film over the first TMR film, the second bottom lead, and at least a portion of the dielectric layer, the second TMR film being different than the first TMR film; and removing a first portion of the second TMR film disposed over the first TMR film such that the second TMR film is disposed on the second bottom lead.

9. The method of claim 8, further comprising pattern formation of a first resistor, a second resistor, a third resistor, and a fourth resistor with designated geometries or shapes.

10. The method of claim 9, further comprising:

forming first top leads over the first resistor and the fourth resistor comprising the first TMR film and second top leads over the second resistor and the fourth resistor comprising the second TMR film, wherein the first resistor is adjacent to the second resistor and the third resistor, the second resistor is adjacent to the first resistor and the fourth resistor, the third resistor is adjacent to the first resistor and the fourth resistor, and the fourth resistor is adjacent to the second resistor and the third resistor.

11. The method of claim 10, wherein the first TMR film comprises a synthetic anti-ferromagnetic pinned layer having a magnetization direction of a first reference layer orthogonal to a magnetization direction of a first free layer.

12. The method of claim 10, wherein the second TMR film comprises a double synthetic anti-ferromagnetic pinned layer having magnetization directions orthogonal to a magnetization direction of a second free layer.

13. The method of claim 8, wherein a reference layer of the first TMR film has a magnetization direction anti-parallel to a magnetization direction of a first pinned layer of the first TMR film, and wherein the second TMR film comprises a second reference layer, a second pinned layer, and a third pinned layer disposed between the second reference layer and the second pinned layer, the second reference layer having a magnetization direction parallel to a magnetization direction of the second pinned layer and anti-parallel to a magnetization direction of the third pinned layer.

14. A method of fabricating a TMR sensor device, comprising:

forming one or more bottom leads, wherein each of the one or more bottom leads is separated from adjacent bottom leads by a dielectric layer;

depositing a first TMR film over the one or more bottom leads and the dielectric layer, the first TMR film comprising a synthetic anti-ferromagnetic pinned layer having a magnetization direction of a first reference layer orthogonal to a magnetization direction of a first free layer;

depositing a first photoresist over a first portion of the first TMR film and at least a first bottom lead;

etching a second portion of the first TMR film to expose at least a second bottom lead such that the first TMR film is disposed on the first bottom lead;

removing the first photoresist;

depositing a second TMR film over the first TMR film, the second bottom lead, and the dielectric layer, the second TMR film comprising a double synthetic anti-ferromagnetic pinned layer having magnetization direction of a second reference layer orthogonal to a magnetization direction of a second free layer and opposite to the magnetization direction of the first reference layer of the first TMR film;

depositing a second photoresist over a first portion of the second TMR film and the second bottom lead;

etching a second portion of the second TMR film to expose the first TMR film such that the second TMR film is disposed on the second bottom lead; and removing the second photoresist.

15. The method of claim 14, further comprising pattern formation of a first resistor, a second resistor, a third resistor, and a fourth resistor with designated geometries or shapes.

16. The method of claim 15, further comprising forming first top leads over the first resistor and the fourth resistor comprising the first TMR film and second top leads over the second resistor and the fourth resistor comprising the second TMR film.

17. The method of claim 15, wherein each of the first, second, third, and fourth resistors is a TMR resistor or a TMR resistor array.

18. The method of claim 15, wherein the first, second, third, and fourth resistors are disposed in a same plane.

19. The method of claim 15, wherein the first resistor is adjacent to the second resistor and the third resistor, the second resistor is adjacent to the first resistor and the fourth resistor, the third resistor is adjacent to the first resistor and the fourth resistor, and the fourth resistor is adjacent to the second resistor and the third resistor.

20. The method of claim 14, wherein the first portion of the first TMR film and the first portion of the second TMR film are equal in size.

* * * * *